(12) United States Patent
Yamazaki et al.

(10) Patent No.: US 6,171,760 B1
(45) Date of Patent: Jan. 9, 2001

(54) LITHOGRAPHIC METHOD UTILIZING CHARGED PARTICLE BEAM EXPOSURE AND FLUORESCENT FILM

(75) Inventors: Yuichiro Yamazaki; Motosuke Miyoshi, both of Tokyo (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/345,447

(22) Filed: Jul. 1, 1999

(30) Foreign Application Priority Data

Jul. 2, 1998 (JP) .................................................. 10-187625

(51) Int. Cl.$^7$ ....................................................... G03C 5/00
(52) U.S. Cl. ........................... 430/296; 430/302; 430/942
(58) Field of Search ..................................... 430/296, 302, 430/942

(56) References Cited

U.S. PATENT DOCUMENTS 5,298,363 * 3/1994 Weiss ..................................... 430/296

FOREIGN PATENT DOCUMENTS 63-53922    3/1988 (JP) .

* cited by examiner

*Primary Examiner*—Christopher G. Young
(74) *Attorney, Agent, or Firm*—Finnegan, Henderson, Farabow, Garrett, & Dunner, L.L.P.

(57) ABSTRACT

A lithography method is applied to a lithography system comprising a charged particle beam generation section for generating a charged particle beam, a mask stage for holding a transfer mask to which the charged particle beam is applied, and a wafer stage for holding a wafer to be processed so as to face the charged particle beam generation section via the transfer mask. A fluorescent film is disposed between the transfer mask and the wafer coated with a photoresist thereon. When the fluorescent film is irradiated with the charged particle beam which passes through an opening of the transfer mask, an ultraviolet light is emitted from the fluorescent film and applied onto the photoresist film formed on the wafer.

7 Claims, 2 Drawing Sheets

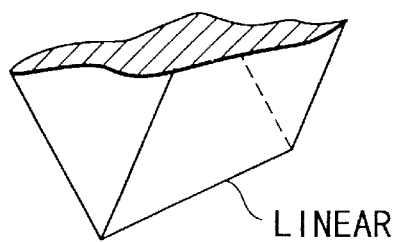
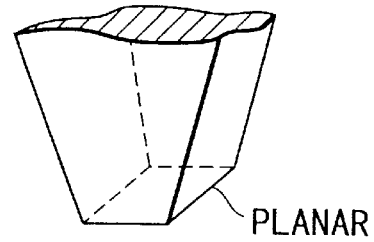
FIG. 3A        FIG. 3B
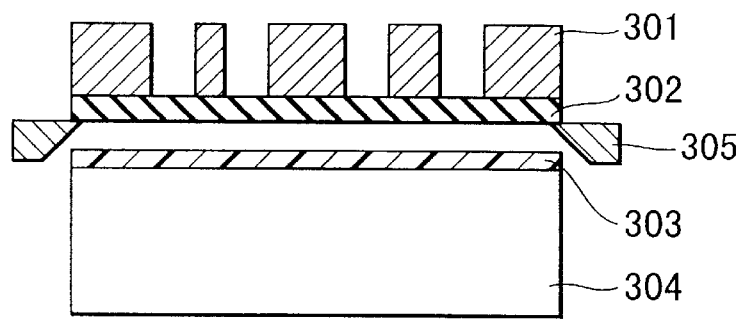
FIG. 4
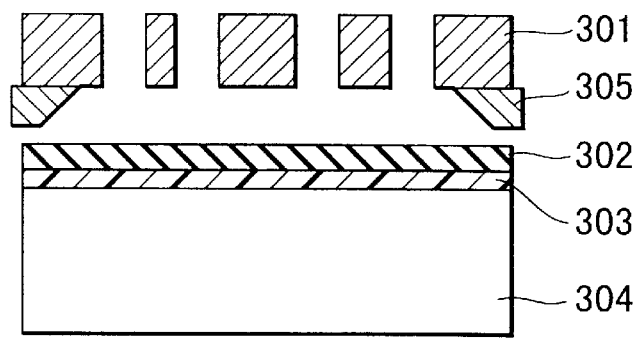
FIG. 5
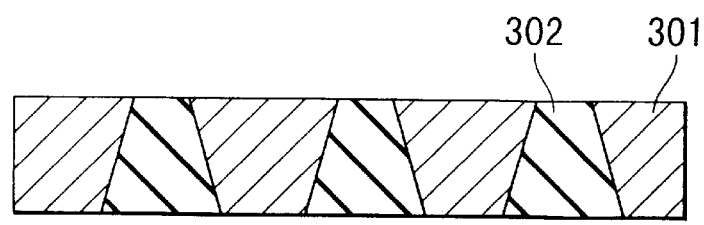
FIG. 6

LITHOGRAPHIC METHOD UTILIZING CHARGED PARTICLE BEAM EXPOSURE AND FLUORESCENT FILM

BACKGROUND OF THE INVENTION

The present invention relates to a lithography method and a lithography system using a charged particle beam, and more particularly, to a lithography method and system in which a photoresist film is irradiated with light while the charged particle beam is applied. More specifically, the present invention is applied to a character projection method and system for a mask pattern using an electron beam.

Recently, in a photolithography technology for LSI, shorter-wavelength light has been increasingly used for obtaining a micro pattern. Furthermore, lithographic techniques using a charged particle beam and X-rays have been proposed to attain a direct writing of the micro pattern.

FIG. 1 is a schematic view of a conventional lithography system using an electron beam. The system shown in FIG. 1 comprises a thermal cathode 401, a wehnelt electrode 402, an aperture 403 having a rectangular opening for shaping a beam, a first beam-shaping electron lens 404, a beam deflector 405, a second beam-shaping electron lens 406, a mask stage 407, a transfer mask 408 mounted on the mask stage, a demagnification lens 409, an objective lens 410, a beam deflector 411, a wafer stage 413, and a wafer 412 mounted on the wafer stage and having a photoresist film coated on the upper surface thereof.

In the lithography system having the aforementioned structure, electrons emitted from an electron gun, which is composed of the thermal cathode 401 and the wehnelt electrode 402, are allowed to pass through the aperture 403 to form a rectangular beam. Furthermore, the electron beam is applied onto the transfer mask 408 by the function of the beam-shaping electron lenses 404 and 406. At this time, by using the beams deflector 405 interposed between the beams shaping electron lenses 404 and 406, an arbitrarily chosen position on the transfer mask 408 can be irradiated. The transfer mask 408 has an opening portion whose shape is obtained by synthesizing a rectangular and an ellipse. Therefore, if the opening portion on the transfer mask 408 is irradiated with the rectangular shaped beam, the resultant beam is obtained in a desired shape.

In addition, owing to the functions of the beam deflector 405 and the mask stage 407, the electron beam can be applied to an arbitrarily chosen cell pattern portion within the transfer mask 408.

The electron beam passed through the transfer mask 408 is demagnified and projected onto the wafer 412 by means of the demagnification lens 409 and the object lens 411, and then applied to the photoresist film coated on the wafer 412. In this case, the entire surface of the wafer 412 can be irradiated by combining beam deflection by the beam deflector 411 with the movement of the wafer 412 by the wafer stage 413.

According to the direct writing technique on the wafer performed by using the electron-beam lithography system, a micro pattern of 0.2 μm or less can be formed.

However, the direct writing technique on the wafer has problems. The most significant problem is a low productivity. To describe more specifically, the throughput of wafer in the pattern exposure step is low. This is because, in the direct writing technique, a desired beam shape is obtained by applying the rectangular beam to the opening portion of the transfer mask, so that writing has to be made by dividing all patterns to be written in accordance with the rectangular beam shapes. In this method, even if repetition patterns are employed, the patterns are divided and then writing is made. As a result, the number of beam shots drastically increases. It is therefore impossible to improve the throughput. To improve this problem, recently proposed is a cell projection method in which an image of a repetition pattern previously formed on the transfer mask, is transferred onto the wafer. This method suggests the possibility of the high-speed writing using the electron beam.

When pattern exposure of a semiconductor memory is performed by using the electron beam, if the cell array portion is written by the cell projection method (since the cell array portion has a repeat pattern) and the peripheral circuit portion is written by a variable shaped beam varied in shape and size, the number of beam shots can be drastically reduced. As a result, high-speed writing can be attained.

However, even if the aforementioned high speed writing method is used, a beam shot density comes up to $10^4$ to $10^5$ shots/mm$^2$. Therefore, the shot number (density) will restrict the throughput of the wafer. Since the size of the beam shot is determined by characteristics of the electron beam optical system in the lithography system, the low throughput inevitably occurs in the case where the pattern on the transfer mask is demagnified and projected.

On the other hand, as a micro patterning technique more suitable than the optical lithography, X-ray lithography is known. The X-ray lithography has many advantages including linearity and non-interference, over the conventionally-used lithography using visible light and ultraviolet light. However, it has a problem of a low throughput due to a low photosensitivity of resist, difficulty in alignment, and difficulty in mask material selection and in processing thereof.

To solve the low sensitivity of a resist in the X-ray lithography, proposed is a method for increasing an effective sensitivity of the resist by use of a secondary radiation from the fluorescent film (Japanese Patent Application KOKAI Publication No. 63-53922). In this method, since the fluorescent material layer is arranged above the mask material holding thin film (on the X-ray source side), the sensitivity of the resist for X-rays can be auxiliarily increased by application of the secondary radiation generated from the fluorescent material layer. However, the X-ray lithography has many problems to be solved, such as a cost, safety of the X-ray source and an improvement of productivity.

BRIEF SUMMARY OF THE INVENTION

An object of the present invention is to provide a lithography method and a lithography system capable of applying light onto a large area region of the wafer in a one-shot, thereby increasing a throughput of the wafer in a lithography step and improving a productivity.

To attain the aforementioned object, there is provided a lithography method comprising:
  preparing a lithography system having
    a charged particle beam generation section for generating a charged particle beam,
    a mask stage for holding a transfer mask to which the charged particle beam is applied, and
    a wafer stage for holding a wafer to be processed so as to face the charged particle beam generation section via the transfer mask;
  setting the transfer mask on the mask stage;
  setting the wafer coated with a photoresist on the wafer stage;

providing a fluorescent film between the transfer mask and the wafer coated with the photoresist;

irradiating the fluorescent film with the charged particle beam which passes through an opening portion of the transfer mask; and applying a light to the photoresist film formed on the wafer by a light emitted from the fluorescent film.

The step of providing the fluorescent film between the transfer mask and the wafer coated with the photoresist film desirably includes a step of providing the fluorescent film on a surface of the transfer mask facing the wafer so as to face the wafer in close proximity or in contact with the wafer.

The step of providing the fluorescent film between the transfer mask and the wafer coated with the photoresist film may include a step of providing the fluorescent film on a surface of the wafer facing the transfer mask, with the photoresist interposed therebetween.

It is desirable that the fluorescent film emits an ultraviolet light and the photoresist is a resist for the ultraviolet light.

The transfer mask may have a same size pattern as that to be projected to the photoresist.

In the opening portion of the transfer mask, an opening aperture of a surface of the transfer mask facing the wafer is desirably larger in size than an opening aperture of a surface of the transfer mask facing the charged particle beam generation section.

Furthermore, according to the present invention, there is provided a lithography system comprising:

an electron gun a beam-shaping electron lens system for shaping an electron beam emitted from the electron gun into an arbitrary shape;

a wafer stage arranged below the electron lens system, for mounting a wafer having a photoresist film formed thereon;

a wafer stage drive control section for driving and controlling the wafer stage;

a mask stage disposed between the wafer stage and the electron lens system, for holding a transfer mask having a fluorescent film formed on a lower surface thereof, the transfer mask being capable of emitting a light having a wavelength within an ultraviolet range by application of an electron beam;

a mask stage drive control section for driving and controlling the mask stage; and a pattern exposure control section for totally controlling the electron gun, the beam-shaping electron lens system, the wafer stage drive control section, and the mask stage drive control section.

The transfer mask has a metal film for shielding an electron beam, an opening pattern formed corresponding to a desired pattern, for transmitting the electron beam therethrough, and a fluorescent film formed on a lower surface of the transfer mask, for emitting ultraviolet light upon receipt of the electron beam.

In the transfer mask, the fluorescent film formed on the lower surface of the transfer mask may be held while facing the photoresist film formed on the wafer in close proximity or in contact therewith.

The transfer mask is desirably formed of a silicon substrate and a metal thin film is desirably formed on a surface of the silicon substrate other than a surface thereof on which the fluorescent film is formed, and on an inner surface of an opening portion formed in the silicon substrate for transmitting the electron beam therethough.

The transfer mask desirably has an opening portion for transmitting the electron beam therethrough, a diameter of the opening portion gradually increasing from a side near the electron lens toward a side near the wafer.

An electron emission portion of the electron gun desirably has one of a planar form and a linear form.

According to the present invention, there is provided a transfer mask for lithography with a charged particle beam, comprising:

a base plate;

an opening portion formed in the base plate;

a metal film formed on a surface of the base plate onto which a charged particle beam is applied and on an inner surface of the opening portion, for shielding the charged particle beam; and a fluorescent film formed, in a moving direction of the charged particle beam, on a farther portion than a surface of the base plate to which the charged particle beam is applied.

The fluorescent film may be formed over an entire surface of the base plate opposite to the surface to which the charged particle beam is applied or formed within the opening portion.

The base plate may be formed of silicon.

A diameter of the opening portion preferably increases gradually along the moving direction of the charged particle beam.

The fluorescent film desirably emits an ultraviolet light upon application of the charged particle beam.

According to the present invention, it is possible to provide a lithography method and a lithography system capable of applying light onto a large area region of the wafer in a one-shot, thereby increasing a throughput of the wafer in a lithography step and improving productivity.

In the lithography system of the present invention, the electron beam (charged particle beam) is converted into an ultraviolet light. It is therefore possible to use a resist for an ultraviolet light having a high photosensitivity than the resist for the electron beam. Furthermore, the resist for an ultraviolet light is coated on the wafer. It is therefore possible to use the wafer as it is in another lithography system using an ultraviolet light. In the conventional method, when light exposure and electron beam exposure are performed in the same wafer, it is necessary to emit a light or a beam after the wafer is separately coated with a resist for light exposure or a resist for electron beam exposure. Therefore, in the conventional method, it is necessary to perform a series of steps including coating of the resist for light exposure, applying a light, removing the resist, coating the resist for an electron beam, applying the electron beam, removing the resist for the electron beam. Thus, the process of the conventional method is complicated, whereas such a complicated process is not required in the present invention since a light and an electron beam can be applied to the same resist.

The fluorescent film of the transfer mask of the present invention is disposed below the electron beam irradiation surface of the transfer mask. In addition, the fluorescent film of the transfer mask is disposed in close proximity to the resist coated on the wafer or in contact with the resist. It is therefore possible to obtained a clear resist pattern.

Furthermore, the present invention does not require an optical system for demagnification projection since a pattern is projected in the same size. It is therefore possible to construct the electron optical system (including a control system) in a very simple structure, so that miniaturization, lightweight, and cost reduction can be easily attained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A and 3B are perspective views showing shapes of an electron emission surface of an electron emission cathode 101 of FIG. 2;

FIG. 4 is a cross-sectional view showing a positional relationship between a transfer mask having a fluorescent film and the wafer in FIG. 2;

FIG. 5 is a cross-sectional view showing a modified structure of an embodiment of the present invention in which a fluorescent film is attached onto the upper surface of the wafer; and FIG. 6 is a cross-sectional view showing another modified structure of an embodiment of the present invention in which the fluorescent film is arranged within an opening of a mask.

DETAILED DESCRIPTION OF THE INVENTION

Now, embodiments of the present invention will be explained in detail with reference to the accompanying drawings.

Figure 1:
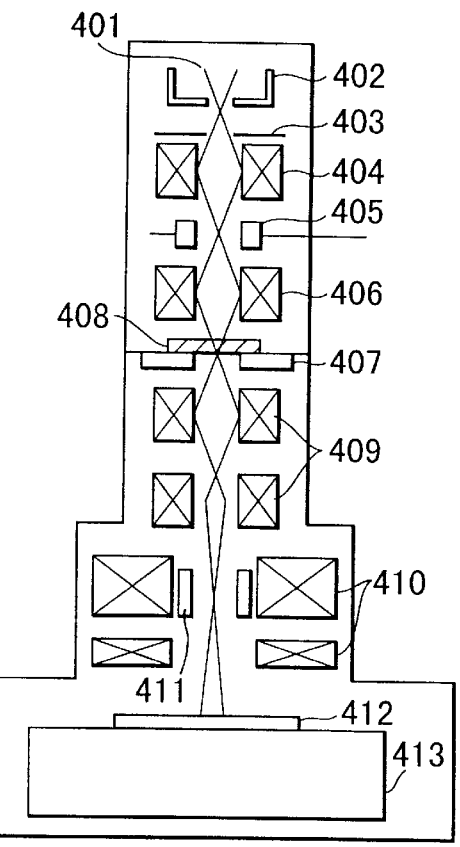
FIG. 1 is a schematic sectional view showing a conventional structure of a lithography system using an electron beam.
Figure 2:
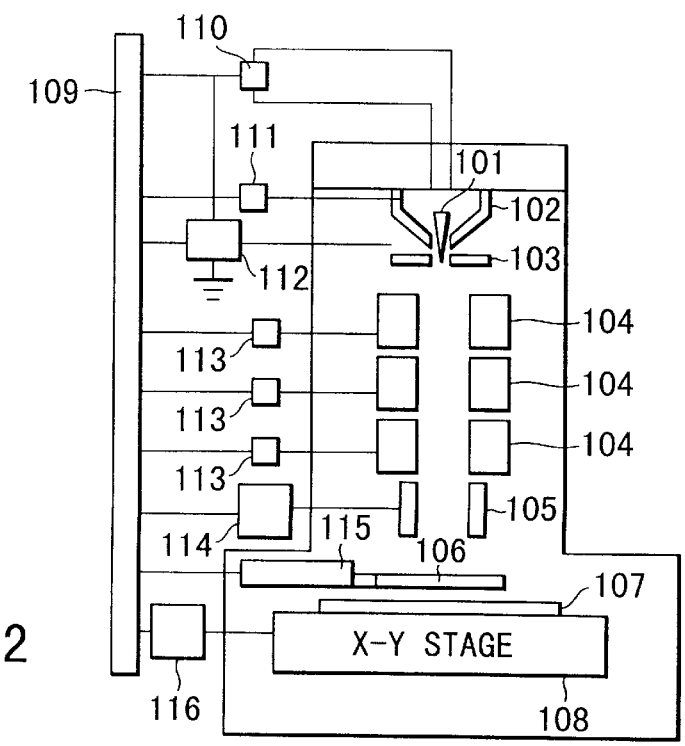
FIG. 2 is a schematic sectional view showing a structure of a lithography system using an electron beam, according to a first embodiment of the present invention.

FIG. 2 shows a schematical structure of a lithography system to be used in a lithography method using an electron beam according to a first embodiment of the present invention. The lithography system is basically a projection lithography system for projecting an image in the same size. The electron beam is converted into an ultraviolet light by a fluorescent film provided in close vicinity to the wafer to irradiate a resist for an ultraviolet light coated on the wafer.

In FIG. 2, reference numeral 101 is an electron emission cathode 101 consisting of a thermal cathode. Reference numerals 102 and 103 are a wehnelt electrode and an anode, respectively. They constitute an electron gun.

Reference numeral 110 is a cathode voltage control section. Reference numerals 111 and 112 are a wehnelt electrode voltage control section and an anode voltage control section, respectively. They constitutes an electron gun control section for controlling the electron gun.

Note that the thermal cathode 101 is formed of, for example, $LaB_6$. Its electron emission surface may be a liner or rectangular form as shown, for example, in FIG. 3A or 3B.

Reference numeral 104 is a beam-shaping electron lens system for shaping the electron beam emitted from the electron gun into an arbitrary form, collimating and applying it onto the transfer mask described later. The electron lens system is constituted of three-stage electrostatic quadrupole lenses.

Reference numeral 105 is a beam deflector. Reference numerals 113 and 114 are a beam-shaping electron lens control section and a beam deflector control section, respectively.

Reference numeral 106 is a transfer mask having a fluorescent film arranged above a wafer 107 having a photoresist film. Reference numeral 115 is a mask stage drive control section for controlling driving of the transfer mask 106 having a fluorescent film.

Reference numeral 108 is a wafer stage (X-Y stage). Reference numeral 116 is a wafer stage drive control section for controlling the driving of the wafer stage 108. Reference Numeral 107 is a wafer having a photoresist film mounted on the wafer stage 108. For example, a chemical sensitization type resist film 303 excellent in photosensitive property is coated on the wafer 304, as shown, for example, in FIG. 4.

Reference numeral 109 is a pattern exposure control section for integrally controlling the electron gun control sections 110-112, the beam-shaping electron lens control section 113, the beam deflector control section 114, the mask stage drive control section 115 and the wafer stage drive control section 116, and usually employs a CPU (central process unit) of a computer system.

The transfer mask 106 has a fluorescent film 302, which emits a light having a wavelength within the ultraviolet region as a consequence of application of the electron beam, is formed on one of the surfaces (a lower surface) of the transfer mask 301, as shown for example, in FIG. 4. The fluorescent film 302 is held by a holder 305 while facing the photoresist film 303 of the wafer 107 at a distance of, for example, several micrometers.

The transfer mask 301 is a metal film for electron beam shielding having an opening pattern corresponding to a transfer pattern. For example, a W or Au thin film is formed on one of the surfaces (an upper surface opposite to the fluorescent film 302 formation surface) of a silicon substrate and on an inner surface of the opening portion.

In this case, the transfer mask 301 has a sufficient thickness such that the electron beam does not pass therethrough. The thickness is defined by an acceleration voltage of the electron beam.

To prevent the electron beam radiated from the upper side of the transfer mask 301 from being scattered in the inner surface of the opening, the opening portion is desirably formed in such a way that its cross section has a reverse taper-form. In other words, it is desirable that a diameter of the opening portion gradually increase from the upper side of the transfer mask 301 toward the lower side.

In the lithography method using a lithography system having a structure shown in FIGS. 2–4, electrons released from the electron gun are converged by the beam-shaping electron lens system 104 and applied upon a one-shot size area of the transfer mask 106 having a fluorescent film. In this case, when the fluorescent film 302 is irradiated with the electron beam passed through the opening pattern (usually having a plurality of openings) of the transfer mask, the fluorescent film 302 radiates a light having a wavelength within the ultraviolet region. On the other hand, the wafer 304 having a photoresist film is arranged so as to face the fluorescent film 302 at a distance as close as several micrometers. It follows that the one-shot size region including a circuit pattern (not a cell pattern) of the photoresist film 303 formed on the wafer 304 is irradiated at a time by a light emitted from the fluorescent film 302.

Accordingly, the large area region on the wafer is irradiated by one shot, with the result that the throughput of the wafer in the pattern exposure process increases, improving the productivity. More specifically, the aforementioned lithography method and apparatus using an electron beam are free from limitation with the shot size applied on the transfer mask. Consequently, the shot size can be increased by increasing the beam size on the transfer mask. As a result, the number of beam shots (shot density) can be reduced, thereby realizing high-speed writing.

As described, in the lithography system of the present invention, since the electron beam (a charged particle beam) is converted into an ultraviolet light by the fluorescent film, it is possible to use a resist for an ultraviolet light having a higher photosensitivity than the resist for an electron beam. It is therefore possible to overcome a problem intrinsic to the electron beam resist, that is, the resist is charged up by the electron beam and bends the beam. Furthermore, since the resist for an ultraviolet light is coated on the wafer, the wafer can be processed as it is in another lithography system for an ultraviolet light. In this method, since the light exposure and the electron beam exposure are performed by using the same resist, a complicated process is not required.

It may be possible to provide the aforementioned fluorescent film on the upper surface of the transfer mask. However, if the fluorescent film is formed on the upper surface of the mask, a light is emitted from the entire fluorescent film by application of the electron beam and enters into the mask openings in a slanting direction. Due to this, a pattern formed on the resist may possibly become blurred. Furthermore, the blurred pattern is produced if the distance between the fluorescent film and the resist is increased. Therefore, the fluorescent film is better to be provided at a position lower than the electron beam irradiation surface of the mask.

In the lithography system of the present invention, the projection is performed in the same size, i.e. 1:1. The mask for the same-size projection used herein can be formed by forming a metal film on a substrate made of a fluorescent material and forming a mask pattern on the metal film by a conventional lithographic technique. Therefore, the same size projection mask can be obtained accurately.

In addition, it is not necessary to use an electron optical system for demagnification projection of the transfer mask pattern which is usually required in a conventional direct writing apparatus using the electron beam. Therefore the electron optical system (including a control system) is formed in a very simple structure, thereby easily attaining miniaturization, lightweight, and a cost reduction.

In the aforementioned embodiments, an electron emission portion serving as the electron emission cathode 101, has a linear or a planar form such as a rectangle. However, the electron emission surface may be formed in any shape, such as a point, disk, rectangular plane, or ellipse. To compensate a loss associated with the emission from the fluorescent film 302, it is desirable to increase the entire emission current amount from the electron emission cathode 101. To do this, the electron emission surface of the electron emission cathode 101 is desirably a planar or a linear form.

To realize an electron gun capable of high efficiency emission, the electron emission surface of the electron emission cathode is desirably a rectangular having a higher aspect ratio than a square, elliptic, or linear form.

The electron emission cathode 101 is not limited to a thermal cathode made of $LaB_6$ or the like. A thermal field emission cathode such as ZrO/W, and further, a cold field emission cathode such as W may be used.

The beam-shaping electron lens system 104 is responsible for shaping the electron beam emitted from the electron gun into an arbitrary shape and collimating and applying it onto the transfer mask. The beam-shaping electron lens system is not limited to the three-stage electrostatic quadrupole lenses. Multipole lenses may be used by arranging in a plurality of stages. The magnetic field type multipole lens may be used. Furthermore, a conventionally-used rotation symmetric electrostatic field/magnetic field lens may be combined with a beam shaping aperture.

It is advantageous that the multipole lens of 8 poles or more is used by being superimposed with a lens electrode, since the beam deflection and stigmatism correction can be made. Furthermore, if the magnetic field multipole lens is combined with the electrostatic field multipole lens, the combined lenses are advantageously used as a chromatic aberration correcting lens. Moreover, if a rotation symmetric lens is used, assembling can be made simply and accurately even though the current density is decreased.

As the fluorescent film 302, there is a material capable of emitting a light within the ultraviolet region, such as an organic scintillator (plastic scintillator) including NE105, NE110, PILOTB, and PILOTY. The organic scintillator used herein is a mixture of a solvent (polystyrene, polyvinyl) and at least one solute such as p-terphenyl, $C_{18}H_{14}$, $POPOPC_{24}H_{16}N_2O_2$ and so forth.

Other than the organic scintillator, if the material is a fluorescent material capable of emitting a DUV (deep ultra violet) light and high in energy conversion efficiency, the material can be used as the fluorescent film 302. More specifically, the fluorescent material is selected on the basis of criteria: a maximum emission wavelength within 400 nm or less and an energy conversion efficiency of 2.5% or more. Note that the energy conversion efficiency of 2.5% or more is a theoretically obtained value assuming that it is sufficient as long as the same properties as in the conventional optical lithography are attained.

Note that in the transfer mask 106 having a fluorescent film of the aforementioned embodiments, the fluorescent film 302 formed on the lower surface of the transfer mask 301 is arranged so as to face the photoresist film 303 formed on the wafer 304 at a distance of several micrometers. Hence, the photoresist film 303 is exposed to light in close proximity thereto.

The present invention is not limited to this. The fluorescent film 302 may be disposed in touch with the photoresist film 303 so that the photoresist film 303 is directly irradiated with the fluorescent light in contact with the photoresist film. When the distance between the emission portion and the photoresist film 303 is reduced, a higher resolution is obtained than the case where the photoresist film 303 is spaced apart from the fluorescent film 302. However, when the transfer mask 106 having a fluorescent film is removed, defects such as exfoliation of the photoresist film 303 may be produced.

The transfer mask is not limited to the structure shown in FIG. 4. The transfer mask (composed of a silicon substrate having an opening pattern and a W or Au thin film formed on the substrate) may be separated from the fluorescent film 302, and the fluorescent film 302 may be formed on the photoresist film 303 formed on the wafer 304, as shown in FIG. 5.

In this case, an additional process is required for coating the fluorescent film 302 on the wafer but the following advantage can be obtained. That is, when the fluorescent film 302 is irradiated with the electron beam passed through the transfer mask 301, the fluorescent film 302 radiates the underlying photoresist film 303. Hence, if an appropriate developing solution is selected, the fluorescent film 302 and the photoresist film 303 can be simultaneously developed. Furthermore, since the fluorescent film 302 is in contact with the photoresist film 303, a high resolution can be obtained.

The transfer mask 301 (composed of a silicon substrate having an opening pattern and a W or Au thin film formed thereon) may have the fluorescent film 302 embedded in the opening thereof, as shown in FIG. 6. In this structure, since the fluorescent film and the mask pattern are integrated, the entire structure of the transfer mask is simplified. In addition, since the distance between the focal point (mask surface) of the electron beam and the light emission portion is small, the resultant light image can be obtained with a minimum degree of blur.

In the aforementioned embodiments, a lithography method and system using an electron beam has been explained. The beam to be used in the present invention is not limited to the electron beam. More specifically, the present invention can be applied to the lithography method and system using an ion beam, in general, a charged particle beam.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lithography method comprising the steps of:
   preparing a lithography system having
      a charged particle beam generation section for generating a charged particle beam,
      a mask stage for holding a transfer mask to which the charged particle beam is applied, and
      a wafer stage for holding a wafer to be processed so as to face the charged particle beam generation section via the transfer mask;
   setting the transfer mask on the mask stage;
   setting the wafer coated with a photoresist on the wafer stage;
   providing a fluorescent film between the transfer mask and the wafer coated with the photoresist;
   irradiating the fluorescent film with the charged particle beam which passes through an opening portion of the transfer mask; and
   applying a light onto the photoresist film formed on the wafer by a light emitted from the fluorescent film.

2. A lithography method according to claim 1, wherein the step of providing the fluorescent film between the transfer mask and the wafer coated with the photoresist film includes a step of providing the fluorescent film on a surface of the transfer mask facing the wafer so as to face the wafer in close proximity thereto.

3. A lithography method according to claim 1, wherein the step of providing the fluorescent film between the transfer mask and the wafer coated with the photoresist film includes a step of providing the fluorescent film on a surface of the transfer mask facing the wafer so as to face the wafer in contact with the wafer.

4. A lithography method according to claim 1, wherein the step of providing the fluorescent film between the transfer mask and the wafer coated with the photoresist film includes a step of providing the fluorescent film on a surface of the wafer facing the transfer mask, with the photoresist interposed therebetween.

5. A lithography method according to claim 1, wherein the fluorescent film emits an ultraviolet light and the photoresist is a resist for the ultraviolet light.

6. A lithography method according to claim 1, wherein the transfer mask has a same size pattern as that to be projected to the photoresist.

7. A lithography method according to claim 1, wherein, in the opening portion of the transfer mask, an opening aperture of a surface of the transfer mask facing the wafer is larger in size than an opening aperture of a surface of the transfer mask facing the charged particle beam generation section.

* * * * *